United States Patent
Chen et al.

(10) Patent No.: US 6,522,013 B1
(45) Date of Patent: Feb. 18, 2003

(54) PUNCH-THROUGH VIA WITH CONFORMAL BARRIER LINER

(75) Inventors: Robert C Chen, Los Altos, CA (US); Jeffrey A. Shields, Sunnyvale, CA (US); Robert Dawson, Austin, TX (US); Khanh Tran, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 548 days.

(21) Appl. No.: 09/136,527

(22) Filed: Aug. 19, 1998

Related U.S. Application Data

(63) Continuation-in-part of application No. 08/992,627, filed on Dec. 18, 1997, now abandoned.

(51) Int. Cl.[7] .......................... H01L 23/48; H01L 23/52
(52) U.S. Cl. ....................... 257/774; 257/751; 257/752; 257/763
(58) Field of Search ................................. 257/751, 752, 257/753, 758, 759, 760, 762–765, 767, 768, 771, 773, 774

(56) References Cited

U.S. PATENT DOCUMENTS 5,470,790 A * 11/1995 Myers et al. ................ 257/774
5,723,382 A * 3/1998 Sandhu et al. .............. 438/653

\* cited by examiner

*Primary Examiner*—Tom Thomas
*Assistant Examiner*—Hung Kim Vu

(57) ABSTRACT

Punch-through vias are filled by initially depositing a thin, conformal layer of titanium nitride by chemical vapor deposition to cover an exposed upper surface of a lower metal feature, e.g. portions exposed by penetrating and undercutting an anti-reflective coating. A metal such as tungsten is subsequently deposited to fill the punch-through via. Embodiments include thermal decomposition of an organic-titanium compound, such as tetrakis-dimethylamino titanium, and treating the deposited titanium nitride in an $H_2/N_2$ plasma to lower its resistivity. Moreover, the thickness of the anti-reflective coating can be reduced and the process window for etching the via widened.

10 Claims, 3 Drawing Sheets

PUNCH-THROUGH VIA WITH CONFORMAL BARRIER LINER

This application is a continuation-in-part of U.S. patent application Ser. No. 08/992,627, entitled Punch-Through VIA with Conformal Barrier Liner, filed Dec. 18, 1997 abandoned.

TECHNICAL FIELD

The present invention relates to manufacturing high density, multi-metal layer semiconductor devices with a reliable interconnection pattern and, more particularly, to manufacturing high density multi-metal layer semiconductor devices with design features of 0.25 microns and under.

BACKGROUND ART

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional interconnection technology, including conventional photolithographic, etching, and deposition techniques.

Conventional methodology for forming patterned metal layers employs a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region or gate electrode. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer, such as spin-on-glass (SOG) or high density plasma (HDP) oxide, is then applied to fill in the gaps, and the surface is planarized, for example, by conventional etching or chemical-mechanical polishing (CMP) planarization techniques.

As feature sizes, e.g., metal lines and interwiring spacings, shrink to match 0.25 micron design rules and below, such as 0.18 microns, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad for the through-hole. Upon filling the through-hole with conductive material, such as a metal plug to form a conductive via, the bottom surface of the conductive via is in contact with the metal feature.

A conventional conductive via is illustrated in FIG. 1, wherein a first metal feature 100 of a first patterned metal layer is formed on first dielectric layer 110 and exposed by a through-hole 120 etched in second dielectric layer 130. The first metal feature 100, which has side surfaces that taper somewhat due to etching, typically has a composite structure comprising a lower metal layer 102, e.g., titanium (Ti) or tungsten (W), an intermediate or primary conductive layer 104, e.g., aluminum (Al) or an Al alloy, and an anti-reflective coating (ARC) 106, such as titanium nitride (TiN).

In accordance with conventional practices, the through-hole 120 is formed so that first metal feature 100 meets the bottom opening, thereby serving as a landing pad for the metal plug filling the through-hole 120 to form the conductive via 160. Thus, the bottom surface of the conductive via 160 is in contact with the first metal feature 100. The conductive via 160 electrically connects the first metal feature 100 and a second metal feature 140, which is part of a second patterned metal layer.

The second metal feature 140 is also typically a composite structure comprising a lower metal layer 142, a primary conductive layer 144, and an ARC 146. The plug filling the through-hole 120 to form the conductive via 160 is typically formed as a composite comprising a first adhesion promoting layer 150, which is typically a refractory material, such as TiN, Ti—W, or Ti—TiN, and a primary plug filling metal 170 such as W. Metal features 100 and 140 typically comprise metal lines with interwiring spacings therebetween conventionally filled with dielectric material 180, such as SOG or HDP oxide.

The anti-reflective coating 106 on the first metal feature 100 serves two purposes. First, it improves control over the definition of the photoresist mask through which the patterned metal layer was etched and, hence, the critical dimensions of the first metal feature 100. Fine control over the critical dimensions of the first metal feature are crucial for the ultimate conductance, resistance, and electromigration resistance of the metal line. For this purpose, it is desirable to for the thickness of the anti-reflective coating to be about 250 Å–550 Å.

Second, the anti-reflective coating 106 serves as an etch stop during the formation of the through-hole to prevent "punch through." Punch through occurs when the etching of the through-hole 120 cuts through the anti-reflective coating 106 and exposes the Al or Al-alloy primary conductive layer 104 of the first metal feature 100. Consequently, the Al therein may interact with the tungsten hexafluoride (WF$_6$) vapor used to deposit the W and create Aluminum Fluoride (AlF$_3$), which is an alloy with higher resistivity and other undesirable properties.

Referring to FIG. 2, a first metal feature 200 is formed on a first insulating layer 210. The first metal feature 200 is part of a first patterned metal layer having a lower metal layer 202, an intermediate, primary conductive layer 204, such as Al or an Al alloy, and an upper anti-reflective coating 206. A through-hole 220 is etched in a second dielectric layer 230 and 280, having been formed on the first patterned metal layer. The through-hole 220 is etched completely through the anti-reflective coating 206, resulting in a concavity 222 in the primary conductive layer 204. Depending on the etching chemistry employed and the solvents used to clean the etched through-hole 220, a portion of the conductive layer 104 beneath the anti-reflective coating 206 is typically penetrated and undercut as the thickness of the anti-reflective coating 206 is optimized for photolithographic processing. Thus, the concavity 222 can extend beneath non-etched portions of the anti-reflective coating 206.

The adhesion promoting layer 150 is conventionally deposited by physical vapor deposition (PVD) or other sputtering techniques and does not provide an effective barrier to the interaction of Al with WF$_6$ during the W deposition. In particular, sputtering TiN does not provide good coverage of the exposed primary conductive layer 104, especially when the primary conductive layer 104 includes an upper surface with a concave portion undercutting the anti-reflective coating 106.

One conventional remedial technique is to sputter a rather thick adhesion promoting layer 150, e.g. about 700 Å to about 800 Å, in an attempt to provide an effective diffusion barrier. However, this approach is disadvantageous because the thick adhesion promoting layer may pinch off the via, leading to voids and increased electrical resistance. Moreover, the resistivity of the adhesion promoting layer 150 is higher, resulting in an increased electrical resistance for the via. Furthermore, sputtering TiN results in a crystalline structure which, even at that thickness, is not entirely effective in reducing diffusion and hence the interaction of Al and $WF_6$, since grain boundaries provide a rapid diffusion path.

Variations in the thickness of the second dielectric layer 130 above the first metal feature extend the minimum required time in etching the through-holes in the second dielectric layer 130. If the etch time is too short, then some through-holes do not reach the metal layer, resulting in a failed electrical connection. On the other hand, if the etching time is too long, then some of the through-holes punch through to the Al of the first metal layer, also resulting in poor electrical connections. The acceptable range of etching time is termed a "process window." In general, a wider process window is more desirable than a narrower process window, because the wider process windows allows for a greater variety of features, for example, shallow and deep contacts, and larger and smaller contacts. Deep contacts are etched for a longer period of time than shallow contacts, and larger contacts etch faster than smaller contacts.

Accordingly, a conventional approach for widening the process window is to increase the thickness of the anti-reflective coating 106, since the anti-reflective coating 106 etches at a much slower rate than the second dielectric layer 130, for example, ten times slower. Thus, a relatively thick anti-reflective coating 106, generally in the range of about 800 Å to 1200 Å, but typically about 1000 Å, is conventionally used to achieve an acceptable process window. There are, however, disadvantages caused by such a thick anti-reflective coating 106. For example, anti-reflective coatings 106 have a higher resistivity and hence thicker anti-reflective coatings 106 result in increased electrical resistance. As another example, thick anti-reflective coatings 106 increases the height of the topography, creating problems such as making planarization more difficult.

DISCLOSURE OF THE INVENTION

There exists a need for a high-density multilevel semiconductor device with design features of 0.25 microns and under and a reliable interconnection structure. A need also exists for a method of manufacturing such a semiconductor device.

There is a need for accommodating a greater variety of features in a semiconductor device, e.g. by widening the process window of etching through-holes without increasing the thickness of the anti-reflective coating.

There exists a need for reducing the thickness of the anti-reflective coating while maintaining the same width of the process window.

There is also a need for preventing the interaction of Al and $WF_6$ in the case that etching of through-holes punches through the anti-reflective layer. Specifically, there exists a need for depositing an effective diffusion barrier that avoids pinching off the vias.

These and other needs are met by the present invention, in which the adhesion promoting layer is deposited by a chemical vapor deposition (CVD) technique. The CVD deposited layer has an amorphous structure and can be formed at a reduced thickness, e.g., about 35 Å to about 250 Å. Advantageously, the CVD deposited adhesion promoting layer prevents pinch off, and, at the same time functions effectively as a diffusion barrier between the Al and the $WF_6$. Consequently, the process window can be widened without the concerns associated with punch through in conventional structure, and/or the thickness of the anti-reflective coating can be reduced, e.g. to about 250 Å to about 750 Å.

Additional needs, objects, advantages, and other features of the present invention will be set forth in part in the description which follows and in part will become apparent to those having ordinary skill in the art upon examination of the following or may be learned from the practice of the invention. The needs, objects, and advantages of the present invention may be realized and obtained as particularly pointed out in the appended claims.

Accordingly, one aspect of the present invention is a semiconductor device comprising: a first dielectric layer formed on a substrate; a patterned metal layer having gaps, formed on the first dielectric layer and including a metal feature with an upper surface; a second dielectric layer formed on the patterned metal layer; a through-hole having an internal surface formed in the second dielectric layer exposing a portion of the upper surface of the metal feature, wherein the exposed portion of the upper surface has a concave section formed during etching the through-hole; a layer of chemical vapor deposited barrier metal lining the internal surface of the through-hole and the concave section of the upper surface of the metal feature; and conductive material filling the through-hole and forming a via.

Another aspect of the present is a method of manufacturing a semiconductor device comprising: forming a first dielectric layer on a substrate; forming a patterned metal layer having gaps on the first dielectric layer, wherein the patterned metal layer includes a metal feature with an upper surface; forming a second dielectric layer on the patterned metal layer; etching to form a through-hole having an internal surface in the second dielectric layer, expose a portion of the upper surface of the metal feature, and form a concave portion in the upper surface of the metal feature; and depositing a layer of barrier material by chemical-vapor-deposition to line the internal surface of the through-hole and the concave portion of the metal feature.

Additional needs, objects, and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

The present invention addresses and solves the punch through problem in forming a via, wherein a portion of the underlying Al conducting layer 104 is exposed during the etching of the through-hole 120. It is very difficult to sputter deposit an effective TiN or Ti—TiN barrier layer without risking pinch off of the via, especially at locations with the anti-reflecting layer is undercut. If an effective barrier film is not formed on the Al conducting layer, reaction with $WF_6$ would occur, increasing the resistance and adversely affecting device performance.

In accordance with the present invention, TiN is deposited by a CVD technique to force the TiN or Ti—TiN barrier layer. It has been recently suggested that CVD TiN can be employed to form a conformal coating in a high aspect ratio through-hole, as by the decomposition of an organic compound containing Ti, such as tetrakis-dimethylamino titanium (TDMAT) or other equivalent compounds. It has also been found that CVD TiN films exhibit a high carbon content and high resistivity. Accordingly, it has also been proposed to treat a deposited CVD TiN film in a hydrogen ($H_2$)/nitrogen ($N_2$) plasma to remove carbon and reduce the resistivity of the CVD TiN film.

See, for example, A. J. Konecni et al., "A STABLE PLASMA TREATED CVD TITANIUM NITRIDE FILM FOR BARRIER/GLUE LAYER APPLICATIONS," pp. 181–183, Jun. 18–20, 1996, VMIC Conference, 1996 ISMIC; Kim et al., "Stability of TiN Films Prepared by Chemical Vapor Deposition Using Tetrakis-dimethylamino Titanium," J. Electrochem. Soc., Vol. 143, No. 9, Sep. 1996, pp. L188–L190; J. Iacoponi et al., "RESISTIVITY ENHANCEMENT OF CVD TiN WITH IN-SITU NITROGEN PLASMA AND ITS APPLICATION IN LOW RESISTANCE MULTILEVEL INTERCONNECTS," Advanced Metalization and Interconnection Systems for ULSI Applications in 1995; Eizenberg et al., "Chemical vapor deposition TiCN: A new barrier metallization for submicron via and contact applications," J. Vac. Sci. Technol. A 13(3), May/Jun. 1995, pp. 590–595; Eizenberg et al., "TiCN: A new chemical vapor deposited contact barrier metallization for submicron devices," Appl. Phys. Lett., Vol. 65, No. 19, Nov. 7, 1994, pp. 2416–2418; and Hillman et al., "COMPARISON OF TITANIUM NITRIDE BARRIER LAYERS PRODUCED BY INORGANIC AND ORGANIC CVD," pp. 246–252, Jun. 9–10, 1992, VMIC Conference, 1992 ISMIC.

Figure 1:
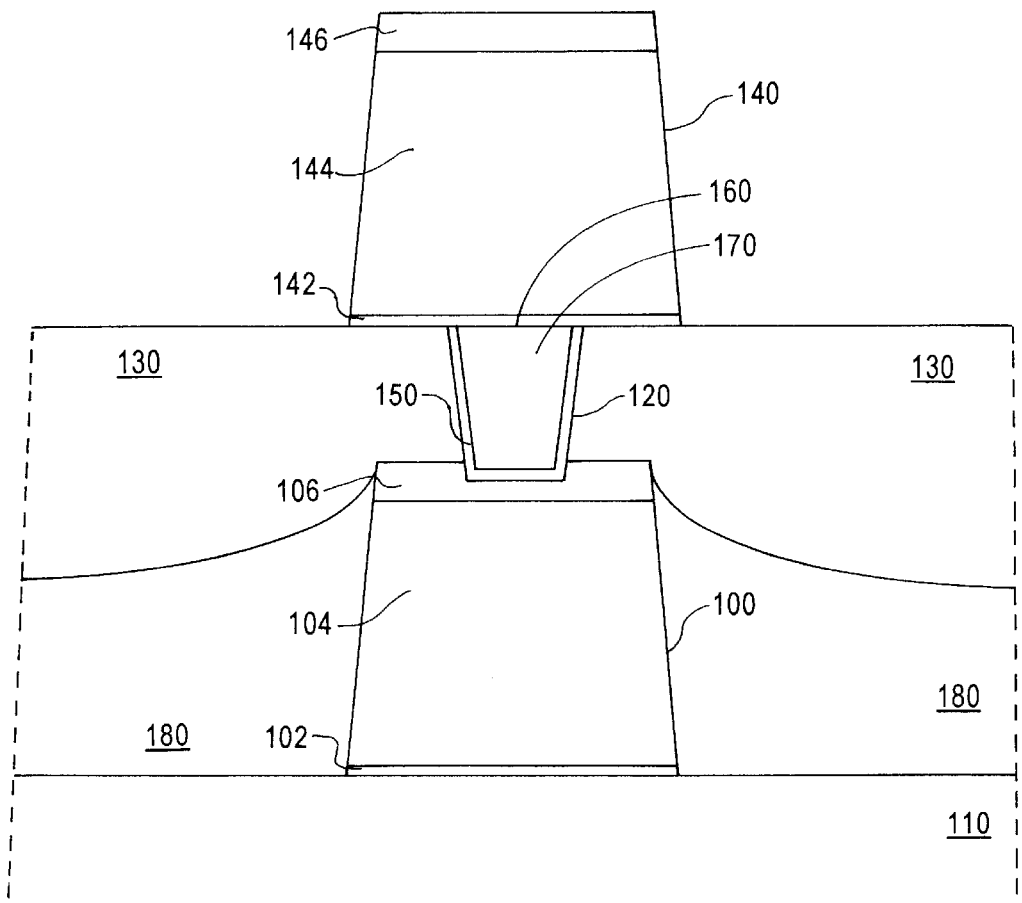
FIG. 1 schematically illustrates a conventional via structure.
Figure 2:
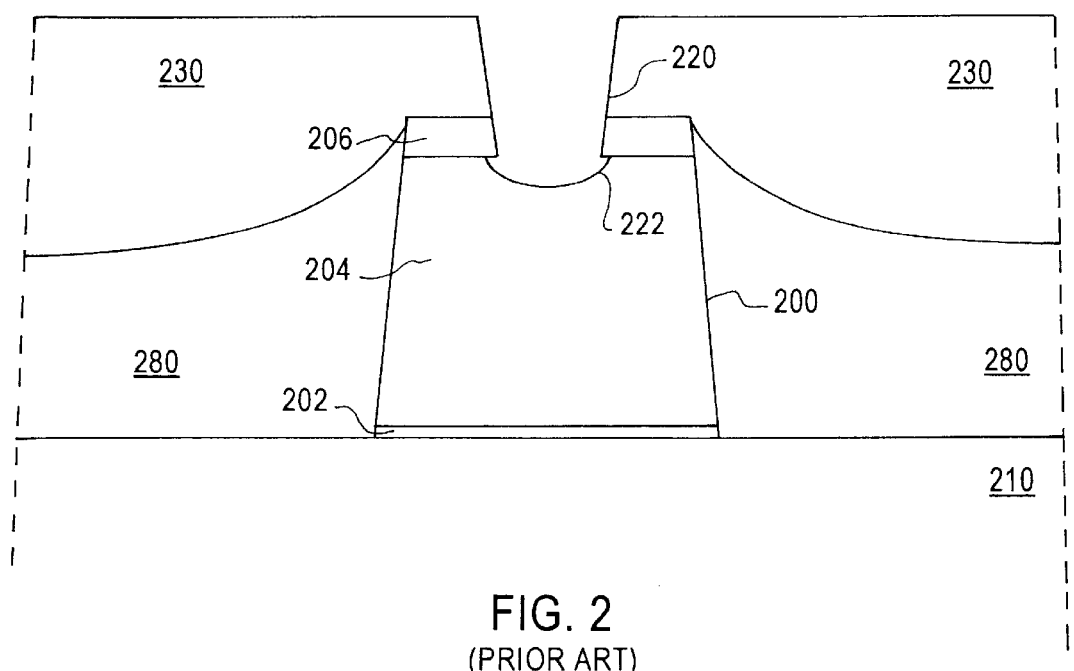
FIG. 2 schematically illustrates the punch through problem in forming a conductive via.

The present invention stems from the unexpected discovery that the use of CVD TiN provides conformal coverage not only in relatively high aspect ratio openings, but also provides a conformal adherent coating on an undercut, concave portion of a lower metal feature such as undercut concavity 222 in FIG. 2, when forming a via that punches through the anti-reflective coating, hereinafter termed a "punch-through via."

In accordance with the present invention, a first patterned metal layer is formed comprising a first metal feature, such as a metal line. The patterned metal layer can be formed by a conventional etch back technique, wherein a metal layer is deposited, a photomask formed thereon, and the metal layer etched to form a design pattern comprising submicron features below about 0.25 microns, e.g., below about 0.18 microns. Alternatively, a patterned metal layer can be formed by damascene techniques.

In accordance with the present invention, a second dielectric layer is formed on the first patterned metal layer, and a through-hole having an internal surface is formed in the second dielectric layer. The filled through-hole is intended to form a punch-through via. Accordingly, the through-hole is etched to expose a portion of an upper surface of the underlying metal feature. As the upper surface of the metal feature does not contain an etch resistant material, such as an anti-reflective coating, the upper surface is etched when forming the through-hole, resulting in concave portion 222 (FIG. 2) extending under anti-reflective coating 206. A conformal TiN barrier layer is then formed by CVD on the internal surface of the through-hole and, unexpectedly, on the undercut concave portion of the upper surface of the underlying first metal feature. In an embodiment of the present invention, CVD is effected by thermal decomposition of an organic titanium compound, such as TDMAT.

The CVD TiN barrier layer, as deposited, typically contains a high concentration of carbon and, hence, exhibits a high resistivity. In an embodiment of the present invention, the CVD TiN barrier layer is treated with a plasma, such as an $H_2/N_2$ plasma, to reduce its carbon content and, consequently, reduce its resistivity. In depositing and plasma treating the CVD TiN barrier layer, the appropriate process parameters can easily be optimized to achieve the objectives of the present invention. For example, the deposition and treatment techniques disclosed in the previously mentioned Konecni et al., Kim et al., and Iocoponi et al. publications can be employed, and the deposition technique disclosed by Eizenberg et al. can be employed. In conducting the $H_2/N_2$ plasma treatment in accordance with the present invention, it has been found suitable to employ a hydrogen flow of about 300 sccm and a nitrogen flow of about 200 sccm, at a temperature of about 450° C., pressure of about 1.3 Torr., RF power of about 750 W and time of about 25 to about 45 seconds, depending on the film thickness.

The CVD TiN barrier layer formed in accordance with the present invention typically exhibits a microstructure comprising amorphous and crystalline regions, such as an amorphous matrix with crystalline regions embedded therein. Since the CVD TiN barrier layer is largely amorphous, there are very little grain boundaries to foster rapid diffusion. Consequently, even CVD TiN barrier layers as thin as about 50 Å to 250 Å can serve as an effective diffusion barrier in contrast to the 700 Å to 800 Å PVD TiN layers.

The metal layers formed in accordance with the present invention are typically formed as a composite structure comprising a bottom metal layer, e.g., Ti or W, a primary conductive metal layer, such as Al or an Al alloy, e.g., an aluminum-copper alloy, and an upper anti-reflective layer, such as Ti—TiN. In patterning the metal layer by the conventional etch back technique, gap filling is conducted in a conventional manner, as by employing a spin-on-dielectric, such as SOG, or by depositing an HDP oxide, preferably an HDP oxide employing the HDP-CVD technique.

It was found that the CVD TiN barrier layers formed in accordance with the present invention, after plasma treating, exhibit a thickness of about 35 Å to about 250 Å, a carbon content less than about 4%–5% and a resistivity less than about 250 micro ohm-cm. Since the CVD TiN barrier layer is very thin, pinching off of the via, which typically occurs with PVD TiN, is substantially or entirely avoided.

After depositing a CVD TiN barrier layer, the through-hole is filled with a conductive material, such as W, employing conventional methodology, such as conventional CVD techniques, to form a composite plug in the borderless via. A second metal layer is then deposited on the second dielectric layer and patterned to form an upper second metal feature electrically connected to the underlying first metal feature through the punch-through via formed in accordance with the present invention.

Figure 3:
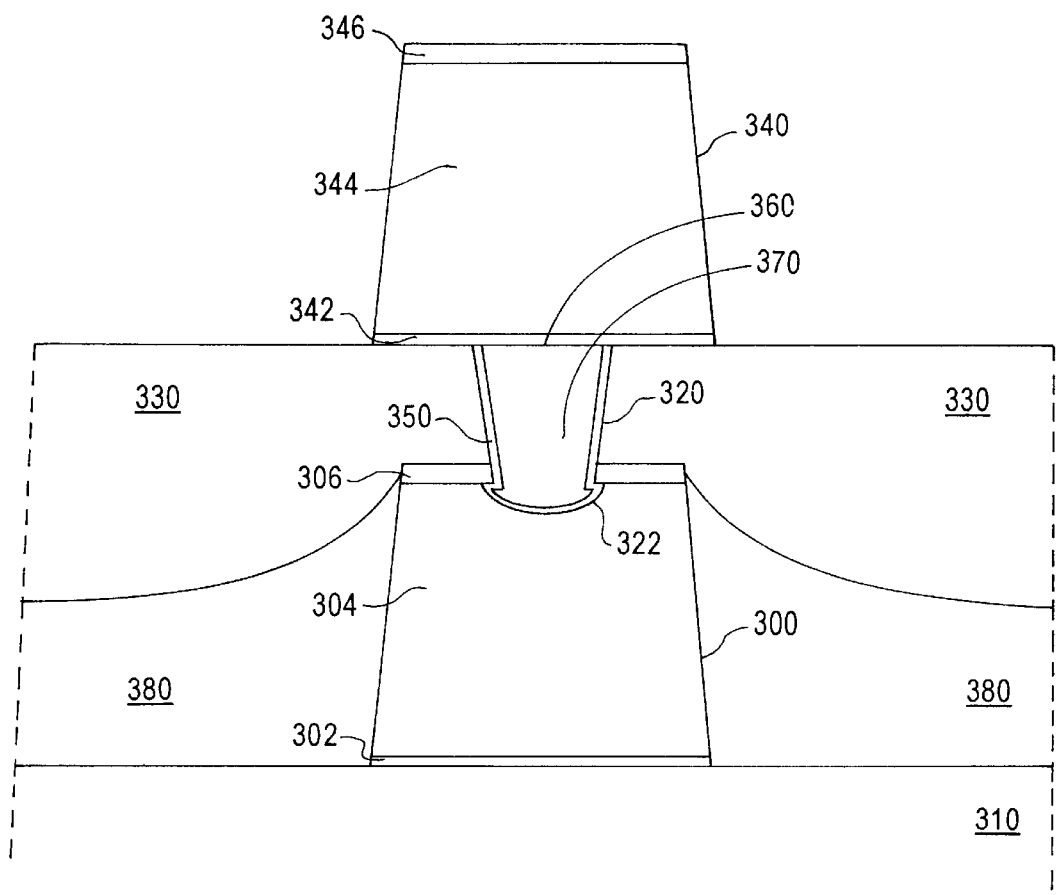
FIG. 3 schematically illustrates a via formed in accordance with an embodiment of the present invention.

An embodiment of the present invention is schematically illustrated in FIG. 3 and comprises a first metal feature 300 formed on first dielectric layer 310 which in turn is formed on a substrate (not shown), such as an appropriately doped monocrystalline silicon semiconductor substrate. First metal feature 300, such as a conductive line, comprises first metal layer 302, such as W or Ti, primary conductive metal layer 304, such as Al or an Al alloy, and anti-reflective coating 306, such as Ti—TiN. Gaps, such as interwiring spacings on both sides of first metal feature 300, are filled by dielectric material 380, such as SOG or an HDP oxide. A second dielectric layer 330 is formed on first pattern metal layer and planarized by CMP. Subsequently, a through-hole 320 is formed in second dielectric layer 330 and through the anti-reflective coating 306. As a result, a portion of the underlying side surface of first metal feature 300 is etched to form undercut concavity 322 under the exposed anti-reflective coating 306 portion.

In accordance with the present invention, a conformal TiN layer 350 is formed by CVD, as by thermal decomposition of an organic titanium compound, such as TDMAT. The CVD TiN barrier layer is then exposed to an $H_2/N_2$ plasma treatment to reduce its carbon content and resistivity. The through-hole 320 is then filled with a suitable metal 370, such as W. A second metal layer is then deposited on second dielectric layer 330 and patterned to form a second metal feature 340 comprising first metal layer 342, e.g., Ti or W, primary intermediate metal layer 344, e.g., Al or an Al alloy, and an upper anti-reflective coating 346, such as Ti–TiN. The second metal feature 340 is electrically connected to the first metal feature 300 by a punch-through via 360 comprising conformal CVD TiN layer 350 and W plug 370. The unexpected formation of CVD TiN barrier layer on undercut concave portion 322 underlying exposed anti-reflective coating 306 enables the filling of through-hole 320 without any undesirable reaction with primary metal layer 304.

Since the CVD TiN barrier layer provides an effective diffusion barrier, even in punch-through vias that exhibit undercutting of the anti-reflective coating, the time the through-holes for the vias are etched can be extended, widening the process window. Consequently, the etch time can be extended to better ensure that all the vias can be etched completely through an unevenly applied dielectric layer, improving the yield. Another advantage to a wider process window is that a greater variety of features can be manufactured, in this case, vias with a greater variety of depths and areas.

Moreover, it is no longer necessary to use the Ti—TiN anti-reflective coating as an etch stop. Thus, the thickness of the anti-reflective coating can be reduced from about 800 Å to about 1200 Å to a thickness of about 250 Å to about 750 Å, while maintaining effective control over masking the photoresist for etching the patterned metal layers. The formation of a thinner anti-reflective coating advantageously increases production throughput, since a thinner layer requires less time for deposition.

A punch-through via is electrically connected to the Al conductive layer through the thin CVD TiN barrier, but not through the TiN anti-reflective coating. On the other hand, a via that does not punch through the anti-reflective coating electrically contacts the Al conductive layer through a thinner anti-reflective coating. In either case, the contact resistance for the via is lowered due to a lesser amount of the higher resistivity TiN in the conduction path. In addition, a thinner anti-reflective coating means that the height of the metal features can be reduced, leading to improved planarization and subsequent photolithographic processing.

The present invention is applicable to the production of various types of semiconductor devices, particularly high density, multi-metal layer semiconductor devices, with submicron features of 0.25 microns and below, exhibiting high speed characteristics and improved interconnection reliability. The present invention is cost effective and can easily be integrated into conventional processing.

In carrying out the embodiments of the present invention, the metal layers, particularly the intermediate layer, can be formed of any metal typically employed in manufacturing semiconductor devices, such as Al, Al alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and plasma enhanced chemical vapor deposition (PECVD). Normally, when high melting metal point metals such as tungsten are deposited, CVD techniques are employed. Low melting point metals, such as Al and Al alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device, comprising:

a first dielectric layer, a patterned metal layer having gaps, said patterned metal layer formed on the first dielectric layer and including a metal feature with an upper surface, said patterned layer having a composite structure comprising a bottom layer, an intermediate metal layer, and an upper anti-reflective coating;

a second dielectric layer formed or the patterned metal layer;

a through-hole having an internal surface formed in the second dielectric layer exposing a portion of the upper surface of the metal feature, wherein the exposed portion of the upper surface has a concave section formed during etching the through-hole, said concave section extending beneath and undercutting the anti-reflective coating;

a layer of barrier metal lining the internal surface of the through-hole and the concave section extending beneath and undercutting the anti-reflective coating; and conductive material filling the through-hole and forming a via;

wherein the barrier metal comprises chemical vapor deposited titanium nitride;

wherein the chemical vapor deposited titanium nitride has a microstructure comprising amorphous and crystalline regions;

wherein the intermediate metal layer contains aluminum or an aluminum alloy;

wherein the bottom metal layer comprises titanium or tungsten and the anti-reflective coating comprises titanium-titanium nitride; and wherein the anti-reflective coating has a thickness of about 250 Å to about 750 Å.

2. The semiconductor device of claim 1, wherein the microstructure is characterized by an amorphous matrix containing crystalline regions.

3. The semiconductor device of claim 1, wherein the conductive material in the through-hole comprises tungsten.

4. The semiconductor device of claim 1, wherein the gaps are filled with a dielectric material.

5. The semiconductor device of claim 1, wherein the titanium nitride barrier layer is deposited by decomposing an organic compound comprising titanium.

6. The semiconductor device of claim 5, wherein the organic compound is tetrakis-dimethylamino titanium.

7. The semiconductor device of claim 6, wherein the titanium nitride barrier layer has a carbon content less than about 4% to 5% by weight and a resistivity less than about 250 micro ohm-cm.

8. The semiconductor device of claim 7, wherein the titanium nitride barrier layer has a thickness of about 35 Å to about 250 Å.

9. The semiconductor device of claim 1, wherein the metal feature is a metal line and the gaps comprise inter-wiring spacings.

10. The semiconductor device of claim 1, further comprising another patterned metal layer on the second dielectric layer, wherein the another patterned metal layer includes a second metal feature electrically connected to the first metal feature through the via.

* * * * *

UNITED STATES PATENT AND TRADEMARK OFFICE
CERTIFICATE OF CORRECTION

PATENT NO.      : 6,522,013 B1                                Page 1 of 1
DATED           : February 18, 2003
INVENTOR(S)     : Robert C. Chen et al.

It is certified that error appears in the above-identified patent and that said Letters Patent is hereby corrected as shown below:

<u>Column 8,</u>
Line 51, change "or" to -- on --

Signed and Sealed this

Twenty-fourth Day of June, 2003

JAMES E. ROGAN
*Director of the United States Patent and Trademark Office*